United States Patent [19]

Severin et al.

[11] Patent Number: 5,046,849

[45] Date of Patent: Sep. 10, 1991

[54] DEVICE HAVING AN EXCHANGEABLE SUBSTRATE SLEEVE FOR MEASURING LAYER THICKNESS

[75] Inventors: Petrus J. W. Severin; Gerrit Verspui, both of Eindhoven, Netherlands

[73] Assignee: U.S. Philips Corporation, New York, N.Y.

[21] Appl. No.: 548,422

[22] Filed: Jun. 28, 1990

Related U.S. Application Data

[63] Continuation of Ser. No. 474,318, Jan. 29, 1990, abandoned, which is a continuation of Ser. No. 396,743, Aug. 18, 1989, abandoned, which is a continuation of Ser. No. 210,059, Jun. 22, 1988, abandoned.

[30] Foreign Application Priority Data

Jun. 23, 1987 [NL] Netherlands ......................... 8701463

[51] Int. Cl.$^5$ .............................................. G01B 9/02
[52] U.S. Cl. ..................................... 356/357; 356/355
[58] Field of Search ...................... 356/355, 357, 241; 250/227

[56] References Cited

U.S. PATENT DOCUMENTS 4,753,530 6/1988 Knight et al. ...................... 250/227

OTHER PUBLICATIONS

"Applications of Light Guides in Process Control", Phillips Tech. Review, Severin et al., 1–1987, pp. 58–60.

Primary Examiner—Samuel Turner
Attorney, Agent, or Firm—Bernard Tiegerman

[57] ABSTRACT

A device for the continuous measurement of the thickness of layers which are deposited on a substrate at low pressure, comprising a light source and two light conductors. Both light conductors are present in a pipe closed at one end by an optical window. Said end has an exchangeable sleeve which at one end comprises an optical window and which can be slid so as to fit the pipe in which the light conductors are present.

5 Claims, 1 Drawing Sheet

DEVICE HAVING AN EXCHANGEABLE SUBSTRATE SLEEVE FOR MEASURING LAYER THICKNESS

This is a continuation of application Ser. No. 474,318, filed Jan. 29, 1990 which is a continuation of Ser. No. 396,743, filed Aug. 18, 1989 which is a continuation of Ser. No. 210,059, filed June 22, 1988 all now abandoned.

BACKGROUND OF THE INVENTION

The invention relates to a device for the continuous measurement of the thickness of layers which are deposited on a substrate at low pressure. A first light conductor the light from a light source to the growing layer and a second light conductor guides the light reflected on the interface between substrate and growing layer and the light reflected on the interface between the growing layer and the surrounding atmosphere to a detector. The detector measures layer thicknesses and indicates variations in the intensity of the light as a result of interference between the two reflected light rays which varies with the optical path length in the growing layer.

In Philips Technical Review 43, pp. 58-60, Jan. 1987 a method is described for measuring the thickness of an infrared-reflecting layer during the deposition on the inside of the outer glass envelope of low-pressure sodium lamps. This layer consists of $In_2O_3$:Sn deposition the layer takes place at approximately 500° C.

The known measuring instrument consists of two light conductors having an outside diameter of 2.5 mm and a core diameter of 1.9 mm. Both conductors are provided (at their cold end) with a coupling member to which glass fibre bundles can be connected; they constitute the connection to a light source and a detector, respectively. The light of a light source is guided to the measuring site by one conductor. The beam emanating from the warm end, after reflection at the layer to be measured, is received by the other conductor and guided to the detector. In order to direct the optical axis of the two (parallel) conductors to the same measuring point, the end faces of the conductors are ground and-/or polished at a certain angle to the longitudinal axis.

The principle of the measurement is based on interference. Since the light beam reflects at the two sides of the forming infrared reflection layer, two reflected beams are formed which interfere with each other as a result of a difference in optical path length. When the thickness of the layer increases the detector will consequently observe variations in the intensity of the incident light. From this the thickness of the layer can be monitored at any instant by a processing equipment coupled to the detector. The measuring method may be used to control the deposition process automatically.

The measuring instrument described cannot be used as such for measuring the layer thicknesses of layers which are deposited reactively at low pressure on the outside of a product or on a surface of complex shape for example, by means of a low-pressure CVD process. The use of this type of processes is increasing in technology because herewith a large number of products can be coated simultaneously and in a reproducible manner without the products having to perform complicated movements, for example, in physical vapour deposition processes and the shape is a problem.

SUMMARY OF THE INVENTION

It is the object of the invention to provide a device for the continuous measurement of the thickness of layers which are deposited in a CVD process in particular in a low-pressure CVD process.

The two light conductors are present in a pipe which is closed at one end by an optical window and which consists of a material which can withstand the conditions in the space in which the CVD process is carried out and at this end comprises an exchangeable sleeve which at one end has an optical window and which can be slid so as to fit on the pipe in which the light conductors are present.

A device for measuring layer thicknesses according to the invention can be introduced with the end on which the exchangeable sleeve with optical window is present, into a low-pressure CVD reactor through a suitable aperture provided with suitable sealing means, in which reactor a large number of articles to be provided on the outside with a layer are present. It is inherent in these low-pressure processes that the deposition rate is independent of the position in the reactor. As a result of this it becomes possible on the one hand to provide large numbers of articles with a layer simultaneously and on the other hand a measurement which is representative of the coating process can take place at a technically suitable site. This may be the case, for example, in a large number of halogen lamps the envelope of which is to be provided with a yellow light transmitting interference layer of a number of $\frac{1}{4}\lambda$ layers of alternately a high and a low index of refraction. Before the deposition is started the device for measuring the layer thickness is provided with a sleeve having a clean optical window.

DETAILED DESCRIPTION OF THE PREFERRED EMBODIMENT

Figure 1:
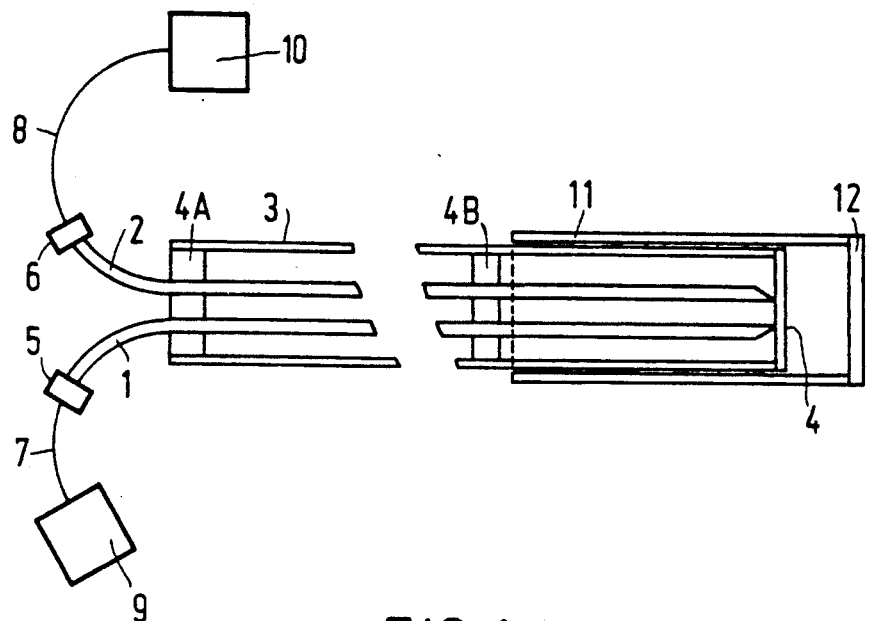
FIG. 1 is a diagrammatic and partial sectional view of a measuring instrument.

The measuring instrument consists in principle of two light conductors 1 and 2 comprising a core and a cladding the refractive index of the core being higher than that of the cladding. The core may have a constant refractive index or a parabolic index distribution over the diameter. In a practical embodiment the core has a diameter of 1.9 mm and the light conductor has a diameter of 2.5 mm. The length of the light conductors matches the technical conditions, for example, the length of the reactor. The coupling of a normal optical fibre or optical fibre bundle to the rod must take place at a site of comparatively low temperature because the said fibre has a synthetic resin cladding. The length may be, for example, 1.5 m. Both light conductors are present in a tube 3 of fused silica, for example, having for example a wall thickness of 2 mm. This tube may also consist of a hard glass or a ceramic rod having two channels accomodating the rods. At the end which is to be inserted into the reactor the tube is closed by an optical window 4, preferably of fused silica. The light conductors 1 and 2 can be positioned accurately in the tube by means of spacers two of which are shown: 4A, 4B.

At the bent ends projecting from the tube the light conductors 1 and 2 are provided with couplings 5 and 6 to which glass fibre bundles 7 and 8 may be connected as shown which form a connection with the light source 9 and the processing equipment including the detector 10, respectively. Tube 3 is closed by window 4 and during the measurement comprises a sleeve of a tube, for example, of quartz glass 11 sealed on one side with an optical window 12. Tube 11 and tube 3 must fit accurately, in practice the inside diameter of the tube 11 may be, for example, 0.5 mm larger than the outside diameter of tube 3 or less. The sleeve may have a length between 20 and 30 cm, so that no reactive gases may penetrate and reach window 4.

Figure 2:
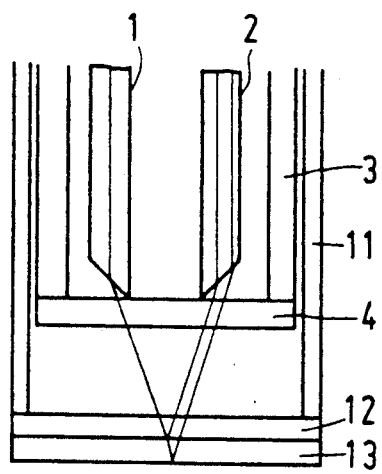
FIG. 2 shows the path of the light beam in greater detail.

FIG. 2 shows the situation during the measurement in greater detail, the end shown is in the reactor during the measurement.

Light from the light source 9 is guided to the measuring site via the glass fibre bundle 7, the coupling 5 and the light conductor 1 (optical window 12) the light beam reflects against both sides of the layer 13 growing on the window 12. Two reflected beams are formed which are the sums of two set of modes which interfere with each other in accordance with the difference in optical path length. In accordance with the thickness in the layer the processing apparatus will observe and signal variations in the intensity of light and optionally convert them into a signal to control the deposition process.

In principle the sleeve 11 would have to have the same length as the tube 3 to prevent the deposition reaction from also taking place on the window 4 closing the tube. In practice, however, it has surprisingly been found that this is not necessary. In the embodiment described in which the sleeve is present entirely within the reactor and has a length between 20 and 30 cm and leaves a gap of 0.5 mm it has been found that at a pressure of 0.3 to 0.9 bar in the reactor less than 1% of the material which was deposited on the outside is deposited on the optical window on the inside of the sleeve during a deposition time of 60 minutes.

A suitable length in practice is 25 cm. The temperature in the reactor during the test was 800° C., alternate layers of $Si_3N_4$ and $SiO_2$ being deposited reactively. By means of the measuring instrument the deposition process in which $\frac{1}{4}\lambda$ layers of alternately a high and a low refractive index were deposited simultaneously on 700 envelopes of incandescent lamps can be controlled.

So it suffices that the length of the gap is larger than the depth of penetration of the gases in the gap during the low pressure CVD process.

We claim:

1. A device for the continuous measurement of the thickness of layers which are deposited on a substrate at low pressure, comprising:

a light source, a pipe, two light conductors within the pipe, the pipe closed at one end by an optical window made from a material that can withstand the conditions in the space when the deposition is carried out; and an exchangeable sleeve slidably and removable mounted on said pipe which sleeve has substrate window at one end and which can be slid so as to fit on the pipe in which the light conductors are present, on which substrate window a layer is deposited by said process, and in which one of the conductors guides the light to the deposited layer and the other light conductor guides the light reflected from the interface between substrate and deposited layer and the light reflecting from the interface between the deposited layer and the surrounding atmosphere to a detector.

2. A device for measuring layer thicknesses as claimed in claim 1, characterized in that the pipe in which light conductors are present and the exchangeable sleeve each comprises of fused silica or hard glass having a softening temperature higher than the temperature to which is exposed during the low-pressure process.

3. A device for measuring layer thicknesses as claimed in claim 1, characterized in that the length of the sleeve and the fitting define a gap having a length which is larger than the depth of penetration of the gases in the gap during the low-pressure CVD process.

4. A device for measuring layer thicknesses as claimed in claim 1, characterized in that the sleeve has a length from 20 to 30 cm.

5. A device for measuring layer thicknesses as claimed in claim 1, characterized in that the sleeve has a length of 30 cm.

* * * * *